(12) United States Patent
Chen

(10) Patent No.: US 9,101,005 B2
(45) Date of Patent: Aug. 4, 2015

(54) PACKAGE OF ENVIRONMENTAL SENSITIVE ELEMENT

(71) Applicant: Industrial Technology Research Institute, Hsinchu (TW)

(72) Inventor: Kuang-Jung Chen, Hsinchu County (TW)

(73) Assignee: Industrial Technology Research Institute, Hsinchu (TW)

( * ) Notice: Subject to any disclaimer, the term of this patent is extended or adjusted under 35 U.S.C. 154(b) by 215 days.

(21) Appl. No.: 13/867,136

(22) Filed: Apr. 22, 2013

(65) Prior Publication Data

US 2013/0229108 A1   Sep. 5, 2013

Related U.S. Application Data

(63) Continuation-in-part of application No. 12/703,155, filed on Feb. 9, 2010, now Pat. No. 8,446,730.

(30) Foreign Application Priority Data

Sep. 15, 2009   (TW) ................................ 98131092 A

(51) Int. Cl.
| | |
|---|---|
| H05K 1/00 | (2006.01) |
| H05B 33/04 | (2006.01) |
| H01L 51/00 | (2006.01) |
| H01L 51/52 | (2006.01) |

(52) U.S. Cl.
CPC ............ *H05B 33/04* (2013.01); *H01L 51/0097* (2013.01); *H01L 51/5253* (2013.01); *H01L 51/5256* (2013.01); *H01L 51/5246* (2013.01); *H01L 2251/5338* (2013.01); *H01L 2251/55* (2013.01); *Y02E 10/549* (2013.01)

(58) Field of Classification Search
CPC ......... H01L 21/02; H01L 21/20; H01L 21/70; H01L 51/04; H01L 51/50; H01L 51/52; H01L 51/5237; H01J 1/62; H01J 9/18; H01J 9/26
USPC .......... 361/750, 749, 751; 313/504, 506, 512; 438/28, 34, 126; 257/59, 72, 83, 86; 445/25

See application file for complete search history.

(56) References Cited

U.S. PATENT DOCUMENTS

| | | | | |
|---|---|---|---|---|
| 5,686,360 | A | * | 11/1997 | Harvey et al. ................... 438/28 |
| 5,757,126 | A | * | 5/1998 | Harvey et al. ................. 313/506 |
| 5,855,994 | A | | 1/1999 | Biebuyck et al. |
| 6,624,568 | B2 | | 9/2003 | Silvernail |
| 8,366,505 | B2 | * | 2/2013 | Yeh et al. ......................... 445/25 |
| 2003/0032210 | A1 | * | 2/2003 | Takayama et al. .............. 438/30 |
| 2003/0034497 | A1 | * | 2/2003 | Yamazaki et al. .............. 257/86 |

(Continued)

*Primary Examiner* — Xiaoliang Chen

(74) *Attorney, Agent, or Firm* — Jianq Chyun IP Office

(57) ABSTRACT

A package of an environmental sensitive element including a flexible substrate, an environmental sensitive element, a flexible sacrificial layer and a packaging structure is provided. The environmental sensitive element is disposed on the flexible substrate. The flexible sacrificial layer is disposed on the environmental sensitive element, wherein the environmental sensitive element includes a plurality of first thin films and the flexible sacrificial layer includes a plurality of second thin films. The bonding strength between two adjacent second thin films is substantially equal to or lower than the bonding strength between two adjacent first thin films. Further, the packaging structure covers the environmental sensitive element and the flexible sacrificial layer.

22 Claims, 10 Drawing Sheets

(56) References Cited

U.S. PATENT DOCUMENTS

| | | |
|---|---|---|
| 2003/0042562 A1 | 3/2003 | Giebeler et al. |
| 2003/0048074 A1 | 3/2003 | Ni et al. |
| 2003/0098647 A1* | 5/2003 | Silvernail et al. ............. 313/506 |
| 2003/0127973 A1* | 7/2003 | Weaver et al. ................ 313/504 |
| 2004/0069985 A1* | 4/2004 | Cok ................................ 257/40 |
| 2004/0150332 A1 | 8/2004 | Hwang et al. |
| 2004/0189196 A1* | 9/2004 | Cok ............................. 313/512 |
| 2004/0197944 A1 | 10/2004 | Chen et al. |
| 2005/0127371 A1* | 6/2005 | Yamazaki et al. ............. 257/72 |
| 2005/0145909 A1 | 7/2005 | Giebeler et al. |
| 2005/0179379 A1 | 8/2005 | Kim |
| 2005/0285519 A1 | 12/2005 | Cok |
| 2005/0285520 A1 | 12/2005 | Cok |
| 2006/0006798 A1 | 1/2006 | Buckley |
| 2006/0269782 A1 | 11/2006 | Liao et al. |
| 2007/0049155 A1 | 3/2007 | Moro et al. |
| 2007/0241674 A1 | 10/2007 | Chao et al. |
| 2008/0012477 A1 | 1/2008 | Koo et al. |
| 2008/0259576 A1 | 10/2008 | Johnson et al. |
| 2008/0303408 A1* | 12/2008 | Yamazaki et al. ............ 313/498 |
| 2008/0303435 A1* | 12/2008 | Cok ............................. 313/506 |
| 2009/0072734 A1 | 3/2009 | Harada et al. |
| 2009/0278449 A1* | 11/2009 | Choi et al. .................... 313/504 |
| 2011/0063808 A1 | 3/2011 | Chen et al. |
| 2012/0024722 A1 | 2/2012 | Chen |
| 2012/0064278 A1 | 3/2012 | Chen |

* cited by examiner

PACKAGE OF ENVIRONMENTAL SENSITIVE ELEMENT

CROSS-REFERENCE TO RELATED APPLICATION

This application is a continuation-in-part application of and claims the priority benefit of U.S. application Ser. No. 12/703,155, filed on Feb. 9, 2010, which claims the priority benefit of Taiwan application serial no. 98131092, filed on Sep. 15, 2009. The entirety of each of the above-mentioned patent applications is hereby incorporated by reference herein and made a part of this specification.

BACKGROUND

1. Technical Field

The present disclosure relates to a package of an environmental sensitive element, and more particularly to a package of an environmental sensitive element having a flexible sacrificial layer.

2. Description of Related Art

Compared with normal rigid substrates, the flexible substrates have a wider range of applications due to their advantages of flexibility, ease of carriage, safety, and wider product application range. However, the drawbacks of the flexible substrate include poor resistance to heat, moisture, oxygen, and chemicals and large thermal expansion coefficient. Since typical flexible substrates cannot entirely avoid the transmission of water vapor and oxygen, devices on these substrates experience accelerated aging. Consequently, these short-lived devices fail to meet their commercial needs. Besides, since the flexible substrate has flexibility, when the flexible substrate is bent, the OLED structure will be damaged by bending force. Thus, the OLED device cannot normally operate.

In the conventional technologies, such as those described in the U.S. Pat. No. 6,624,568 and in the US Patent Publication No. 2007/0049155, the polymer is used as the packaging material for the organic electro-emitting element. Although the resistance to moisture and the oxygen of the polymer is relatively better, the conventional technologies never consider the delaminating problem while the OLED device is bent. Therefore, how to improve the delaminating phenomenon of the OLED device while it is bent is one of the immediate problems to be resolved in the current flexibility of the OLED device.

SUMMARY

The present disclosure provides a package of an environmental sensitive element, wherein the package includes a flexible substrate, an environmental sensitive element, a flexible sacrificial layer and a packaging structure. The environmental sensitive element is disposed on the flexible substrate. The flexible sacrificial layer is disposed on the environmental sensitive element, wherein the environmental sensitive element includes a plurality of first thin films and the flexible sacrificial layer includes a plurality of second thin films, and the bonding strength between two adjacent second thin films is equal to or lower than the bonding strength between two adjacent first thin films. The packaging structure covers the environmental sensitive element and the flexible sacrificial layer.

The present disclosure provides a package of an environmental sensitive element, wherein the package includes a flexible substrate, an environmental sensitive element, a flexible sacrificial layer and a packaging structure. The environmental sensitive element is disposed on the flexible substrate. The flexible sacrificial layer is disposed on the environmental sensitive element, wherein the environmental sensitive element comprises a plurality of first thin films, and the flexible sacrificial layer includes a plurality of second thin films, and the bonding strength between two adjacent second thin films is equal to or lower than the bonding strength between two adjacent first thin films. The second thin films in the flexible sacrificial layer comprise at least one sacrificial thin film and at least one flexible protecting thin film. The at least one sacrificial thin film is disposed on the first thin films, wherein the material of the at least one sacrificial thin film includes organic small molecular material with the molecular weight about 10 g/mol~5000 g/mol or organic oligomers with the molecular weight about 500 g/mol~9000 g/mol. The packaging structure covers the environmental sensitive element and the flexible sacrificial layer.

The present disclosure provides a package of an environmental sensitive element, wherein the package includes a flexible substrate, an environmental sensitive element, a first packaging structure and a first flexible sacrificial layer. The environmental sensitive element is disposed on the flexible substrate. The first packaging structure covers the environmental sensitive element. The first flexible sacrificial layer is disposed on the first packaging structure, and the first flexible sacrificial layer and the environmental sensitive element are located on two opposite sides of the first packaging structure, wherein the environmental sensitive element comprises a plurality of first thin films, the first flexible sacrificial layer includes a plurality of second thin films, and the bonding strength between two adjacent second thin films is equal to or lower than the bonding strength between two adjacent first thin films.

In order to make the aforementioned and other features and advantages of the disclosure more comprehensible, embodiments accompanying figures are described in detail below.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles of the disclosure.

DESCRIPTION OF EMBODIMENTS

First Embodiment

Figure 1A:
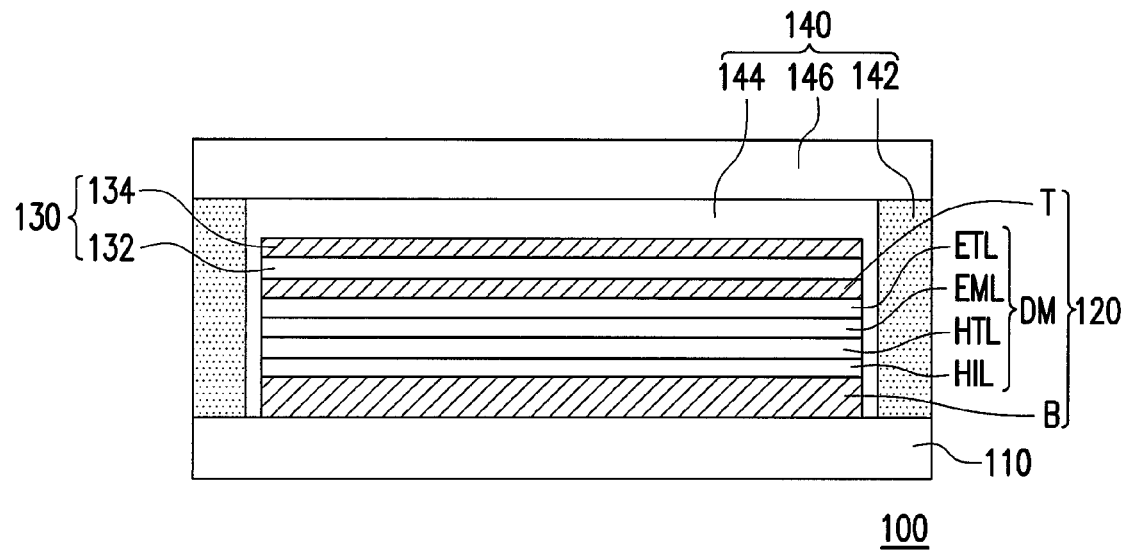
FIG. 1A, FIG. 1B, FIG. 1C and FIG. 1D are the cross-sectional views of a package of an environmental sensitive element according to the first embodiment of the present disclosure.
Figure 1B:
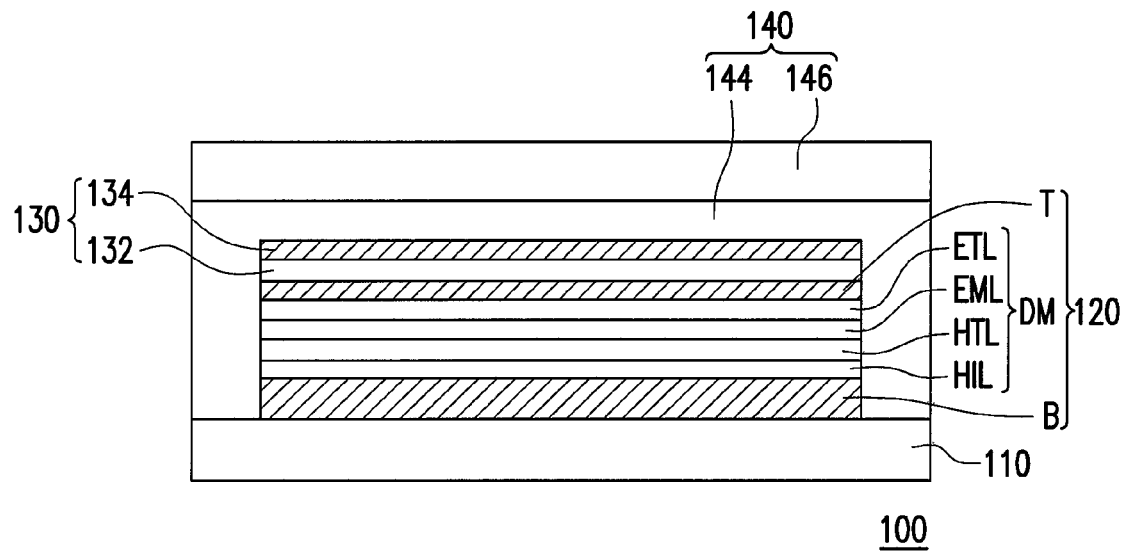

FIG. 1A and FIG. 1B are the cross-sectional views of a package of an environmental sensitive element according to the second embodiment of the present disclosure. As shown in FIG. 1A and FIG. 1B, a package 100 of an environmental sensitive element of the present embodiment includes a flexible substrate 110, an environmental sensitive element 120, a flexible sacrificial layer 130 and a packaging structure 140. The environmental sensitive element 120 is disposed on the flexible substrate 110. The flexible sacrificial layer 130 is disposed on the environmental sensitive element 120, wherein the environmental sensitive element 120 includes a plurality of first thin films (DM, B, T) and the flexible sacrificial layer 130 includes a plurality of second thin films (132 and 134) which are stacked on each other. Further, the bonding strength between two adjacent second thin films (132 and 134) is substantially equal to or lower than the bonding strength between two adjacent first thin films (DM, B, T). The packaging structure 140 covers the environmental sensitive element 120 and the flexible sacrificial layer 130.

In the present embodiment, material of the flexible substrate 110 can be, for example, plastic material such as PE plastic, PMMA, PC (polycarbonate) or PI (polyimide). For instance, the PE plastic can be the flexible plastic material such as PEC, PEN and PES. Moreover, the material of the flexible substrate 110 comprises metal foil.

As shown in FIG. 1A, the environmental sensitive element 120 comprises a bottom electrode layer B, a displaying medium DM and a top electrode layer T. The bottom electrode layer B is disposed on the flexible substrate 110, the displaying medium DM is disposed on bottom electrode layer B and the top electrode layer T is disposed on the displaying medium DM. More clearly, the displaying medium DM is composed of a hole injection layer HIL, a hole transporting layer HTL, an organic electro-emitting layer EML and an electron transporting layer ETL. The hole injection layer HIL is disposed on the bottom electrode layer B, the hole transporting layer HTL is disposed on the hole injection layer HIL, the organic electro-emitting layer EML is disposed on the hole transporting layer HTL, and the electron transporting layer ETL is disposed on the organic electro-emitting layer EML. Furthermore, the top electrode layer T is disposed on the electron transporting layer ETL.

The environmental sensitive element 120 of the present embodiment can be an active matrix element or a passive matrix element. When the environmental sensitive element 120 is the active matrix element, the bottom electrode layer B can be, for example, a pixel electrode of the thin film transistor array and the top electrode layer can be, for example, a common electrode. Meanwhile, the displaying medium between each of the pixel electrodes and the common electrode can be individually driven to emit lights. When the environmental sensitive element 120 is the passive matrix element, the bottom electrode layer B and the top electrode layer are the stripe electrodes, and the bottom electrode layer B and the top electrode layer T are arranged in an interlacing manner. Meanwhile, the displaying medium located at the crossover section where each of the top electrode layer T interlaces the bottom electrode layer B can be individually driven to emit lights. In the present embodiment, the extending direction of the bottom electrode layer B can be, for example, substantially perpendicular to the extending direction of the top electrode layer T.

As shown in FIG. 1A, the flexible sacrificial layer 130 comprises a sacrificial thin film 132 and a flexible protecting thin film 134, wherein the sacrificial thin film 132 is configured on the top electrode layer T of the environmental sensitive element 120 and the flexible protecting thin film 134 is configured on the sacrificial thin film 132. It should be noticed that, the sacrificial thin film 132 of the present embodiment is connected to the top electrode layer T, but the flexible protecting thin film 134 is disconnected to the top electrode layer T. However, in other embodiments of the present disclosure, the flexible protecting thin film 134 disposed on the sacrificial thin film 132 can be connected to the top electrode layer T. The bonding strength between the sacrificial thin film 132 and the top electrode layer T is substantially equal to or lower than the bonding strength between two adjacent first thin films (DM, B and T) so that the delaminating phenomenon hardly happens between the adjacent first thin films (DM, B and T) but easily happens on the interface between the sacrificial thin film 132 and the top electrode layer T and on the interface between the sacrificial thin film 132 and the flexible protecting thin film 134 when the package of the environmental sensitive element is bent. Therefore, the sacrificial thin film 132 and the flexible protecting thin film 134 can effectively protect the first thin films (DM, B and T) from having delaminating phenomenon during the package is bent. In addition, the flexible sacrificial layer 130 further has a UV cutting function so as to increase the life time of the environmental sensitive element 120. And also the flexible sacrificial layer 130 further has a light out coupling function so as to increase the light efficiency of the environmental sensitive element 120.

In the present embodiment, the material of the sacrificial thin films 132 includes organic small molecular compounds, organic oligomers, metal or organic-inorganic co-evaporated material. The molecular weight of the aforementioned organic small molecular material is about 10 g/mol~5000 g/mol and the organic small molecular material includes Alq3 (Tris-(8-hydroxyquinoline)aluminum), alpha-NPB (N,N'-Dis(naphthalene-1-yl)-N,N'-diphenyl-benzidine), CuPc (Phalocyanine copper complex). The molecular weight of the organic oligomers is about 500 g/mol~9000 g/mol and the organic oligomers include Phenylene Vinylene Oligomers or Fluorene Oligomers. The molecular weight of metal or organic-inorganic co-evaporated material is about 3 g/mol~500 g/mol. More clearly, the aforementioned metal can be, for example, Al, Ag, Be, Cr, Cu, Co, Fe, Ge, Ir, In, Mo, Mn, Mg, Ni, Nb, Pb, Pd, Pt, Ru, Rh, Sn, Si, Sb, Se, Ti, Ta, Te, V, W, Zr, Zn, Mg—Ag, Al—Si, Al—Si—Cu, Au/Ge, Au—Be, Au—Ge—N, Ni—Cr, Pb—sn or In—Sn.

In addition, the material of the sacrificial thin film 132 further includes a single or a mixture of aromatic tertiary amine compounds. More clearly, the aromatic tertiary amine compounds may be 1,1-bis(4-di-p-tolylaminophenyl)cyclohexane, 1,1-bis(4-di-p-tolylaminophenyl)-4-phenylcyclohexane, 1,5-bis[N-(1-naphthyl)-N-phenylamino]naphthalene, 2,6-bis(di-p-tolylamino)naphthalene, 2,6-bis[di-(1-naphthyl)amino]naphthalene, 2,6-bis[N-(1-naphthyl)-N-(2-naphthyl)amino]naphthalene, 2,6-bis[N,N-di(2-naphthyl)amine]fluorene, 4-(di-p-tolylamino)-4'-[4(di-p-tolylamino)-styryl]stilbene, 4,4'-bis(diphenylamino)quadriphenyl, 4,4''-bis[N-(1-anthryl)-N-phenylamino]-p-terphenyl, 4,4'-bis[N-(1-coronenyl)-N-phenylamino]biphenyl, 4,4'-bis[N-(1-naphthyl)-N-phenylamino]biphenyl (NPB), 4,4'-bis[N-(1-naphthyl)-N-(2-naphthyl)amino]biphenyl (TNB), 4,4''-bis[N-(1-naphthyl)-N-phenylamino]p-terphenyl, 4,4'-bis[N-(2-naphthacenyl)-N-phenylamino]biphenyl, 4,4'-bis[N-(2-naphthyl)-N-phenylamino]biphenyl, 4,4'-bis[N-(2-perylenyl)-N-phenylamino]biphenyl, 4,4'-bis[N-(2-phenanthryl)-N-phenylamino]biphenyl, 4,4'-bis[N-(2-pyrenyl)-N-phenylamino]biphenyl, 4,4'-bis[N-(3-acenaphthenyl)-N-phenylamino]biphenyl, 4,4'-bis[N-(3-methylphenyl)-N-phenylamino]biphenyl (TPD), 4,4'-bis[N-(8-fluoranthenyl)-N-phenylamino]biphenyl, 4,4'-bis[N-(9-anthryl)-N-phenylamino]biphenyl, 4,4'-bis{N-phenyl-N-[4-(1-naphthyl)-phenyl]amino}biphenyl, 4,4'-bis[N-phenyl-N-(2-pyrenyl)amino]biphenyl, 4,4',4''-tris[(3-methylphenyl)phenylamino]triphenylamine (m-TDATA), Bis(4-dimethylamino-2-methylphenyl)-phenylmethane, N-phenylcarbazole, N,N'-bis[4-([1,1'-biphenyl]-4-ylphenylamino)phenyl]-N,N'-di-1-naphthalenyl-[1,1'-biphenyl]-4,4'-diamine, N,N'-bis[4-(di-1-naphtbalenylamino)phenyl]-N,N'-di-1-naphthalenyl-[1,1'-biphenyl]-4,4'-diamine, N,N'-bis[4-[(3-methylphenyl)phenylamino]phenyl]-N,N'-diphenyl-[1,1'-biphenyl]-4,4'-diamine, N,N-bis[4-(diphenylamino)phenyl]-N',N'-diphenyl-[1,1'-biphenyl]-4,4'-diamine, N,N'-di-1-naphthalenyl-N,N'-bis[4-(1-naphthalenylphenylamino)phenyl]-[1,1'-biphenyl]-4,4'-diamine, N,N'-di-1-naphthalenyl-N,N'-bis[4-(2-naphthalenylphenylamino)phenyl]-[1,1'-biphenyl]-4,4'-diamine, N,N,N-tri(p-tolyl)amine, N,N,N',N'-tetra-p-tolyl-4-4'-diaminobiphenyl, N,N,N',N'-tetraphenyl-4,4'-diaminobiphenyl, N,N,N',N'-tetra-1-naphthyl-4,4'-diaminobiphenyl, N,N,N',N'-tetra-2-naphthyl-4,4'-diaminobiphenyl, or N,N,N',N'-tetra(2-naphthyl)-4,4''-diamino-p-terphenyl.

Moreover, the material of the flexible protecting thin film 134 comprises indium tin oxide (ITO), indium zinc oxide (IZO), aluminum doped zinc oxide (AZO), $WO_3$, $MoO_3$, $SiO_x$, $SiN_x$, $SiO_xN_y$, $Al_2O_3$, Al, Ag, Mg—Ag or Mg—Al. It should be noticed that the materials of the sacrificial thin film 132 and the flexible protecting thin film 134 in the flexible sacrificial layer 130 are selected from different material groups such that the bonding strength between the sacrificial thin film 132 and the flexible protecting thin film 134 is substantially equal to or smaller than the bonding strength between the adjacent first thin films (DM, B and T).

As shown in FIG. 1A, the packaging structure 140 comprises a sealant 142, an adhesion layer 144 and a flexible cover 146. The sealant 142 is disposed on the flexible substrate 110 to encircle the environmental sensitive element 120 and the flexible sacrificial layer 130. The adhesion layer 144 is disposed within the sealant 142 to cover the environmental sensitive element 120 and the flexible sacrificial layer 130. Further, the flexible cover 146 is connected with the sealant 142 and the adhesion layer 144.

As shown in FIG. 1B, the packaging structure 140 can also be other types of structure. For instance, the packaging structure can comprise an adhesion layer 144 and a flexible cover 146, wherein the adhesion layer 144 covers the environmental sensitive element 120 and the flexible sacrificial layer 130, and the flexible cover 146 is connected to the adhesion layer 144.

Figure 1C:
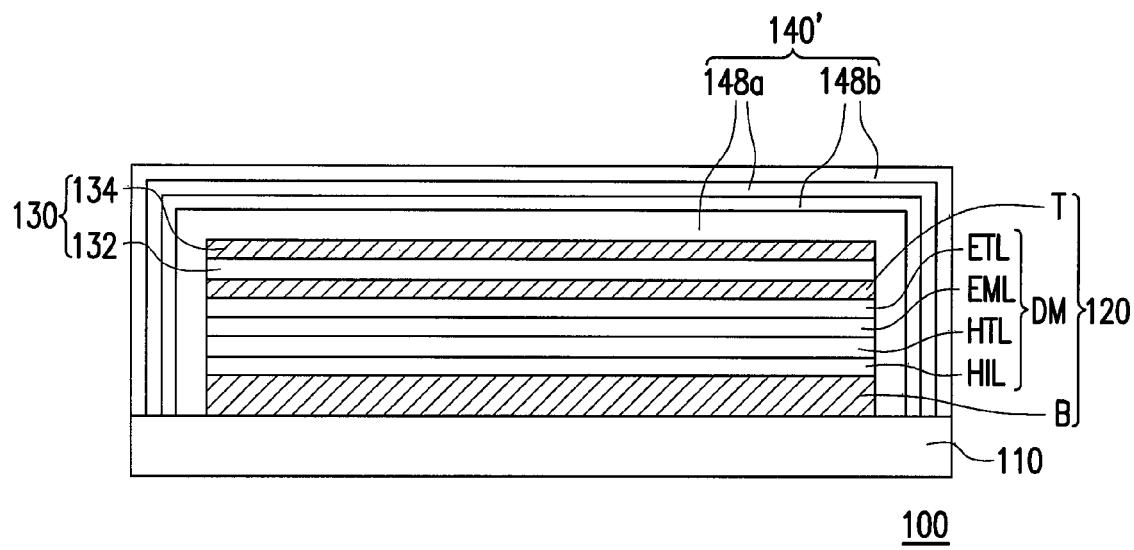

As shown in FIG. 1C, the packaging structure 140' with other packaging structure type is used in the present embodiment. For instance, the packaging structure 140' can comprise a plurality of package thin films. The package thin films include a plurality of organic package thin films 148a and a plurality of inorganic package thin films 148b. The organic thin films 148a and the inorganic thin films 148b are stacked on one another to provide a relatively better moisture-proof ability.

Figure 1D:
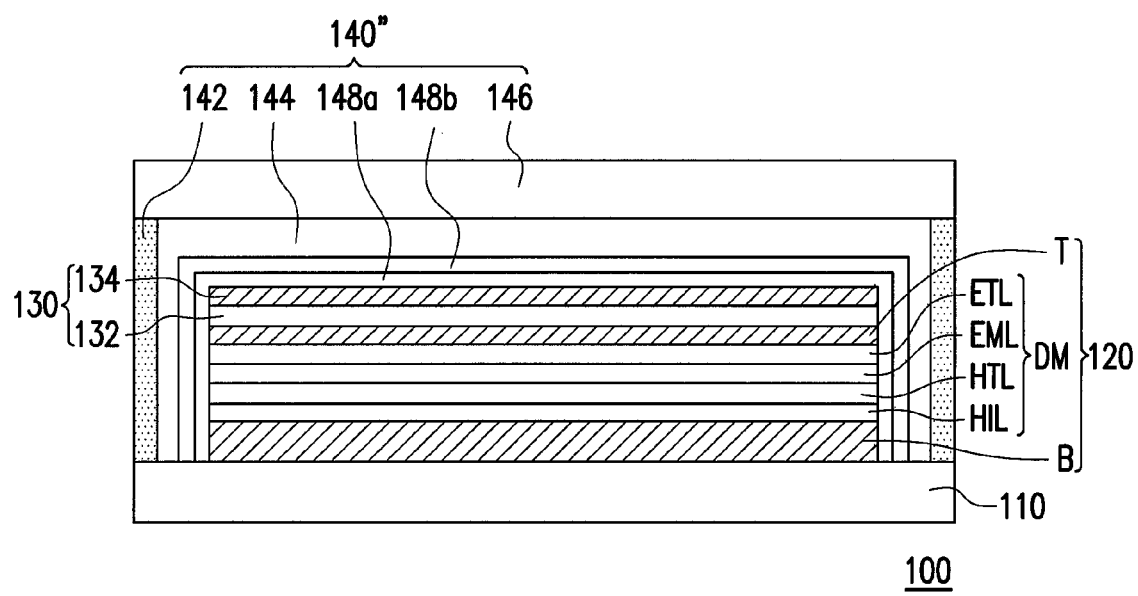

As shown in FIG. 1D, the packaging structure 140'' with other packaging structure type is used in the present embodiment. For instance, the packaging structure 140'' can comprise a sealant 142, an adhesion layer 144, a flexible cover 146, at least one layer of organic package thin films 148a and at least one layer of inorganic package thin films 148b. The organic thin films 148a and the inorganic thin films 148b are stacked on one another to provide a relatively better moisture-proof ability. The sealant 142 is disposed on the flexible substrate 110 to encircle the environmental sensitive element 120 and the flexible sacrificial layer 130. The adhesion layer 144 is disposed within the sealant 142 to cover the organic package thin films 148a, the inorganic package thin films 148b and the flexible sacrificial layer 130. Further, the flexible cover 146 is connected with the sealant 142 and the adhesion layer 144.

It should be noticed that the aforementioned organic package thin films 148a and the inorganic package thin film 148b can be arranged alone or alternately stacked on one another.

In a present embodiment, the material of the top electrode layer T can be, for example, as same as the material of the flexible protecting thin film 134, and the material of the sacrificial thin film 132 can be, for example, as same as the material of the hole transporting layer HTL. Therefore, the process for forming the flexible sacrificial layer 130 can be integrated with the process for forming the environmental sensitive element 120. In other words, the flexible sacrificial layer 130 and the environmental sensitive element 120 can be manufactured in the same process chamber without further modifying the current process procedure.

Second Embodiment

Figure 2A:
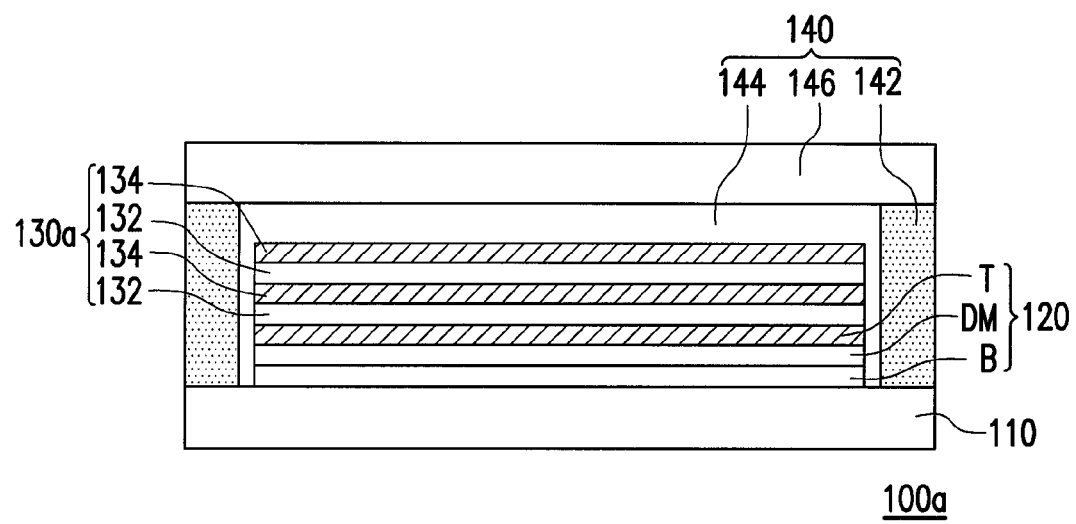
FIG. 2A and FIG. 2B are the cross-sectional views of a package of an environmental sensitive element according to the second embodiment of the present disclosure.
Figure 2B:
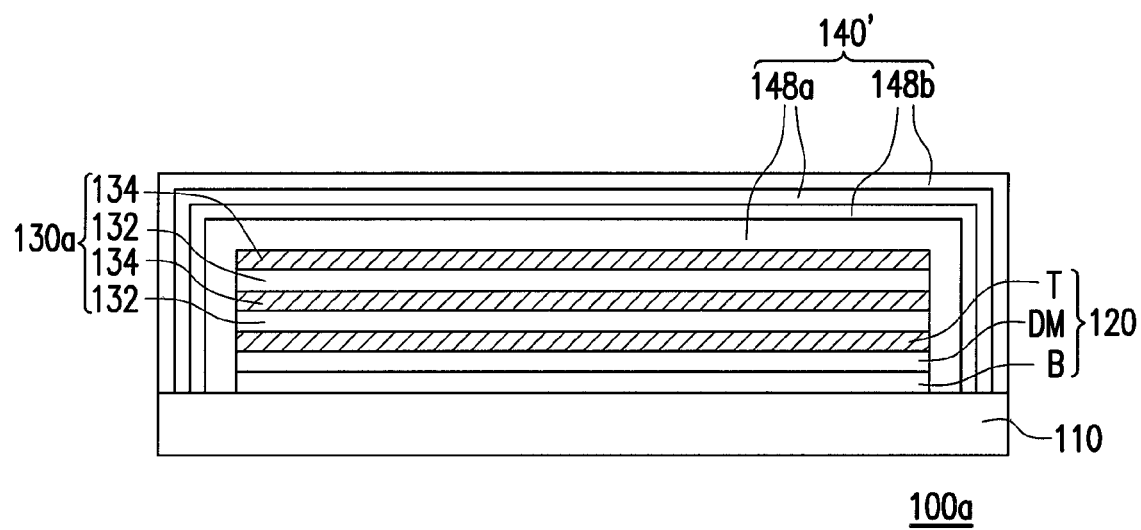

FIG. 2A and FIG. 2B are the cross-sectional views of a package of an environmental sensitive element according to the second embodiment of the present disclosure. As shown in FIG. 2A and FIG. 2B, the package 100a of the environmental sensitive element of the present embodiment is similar to the package 100 of the environmental sensitive element of the first embodiment. More clearly, the thin film structure of the flexible sacrificial layer 130a in the package 100a is different from that of the flexible sacrificial layer 130 in the package 100. The flexible sacrificial layer 130a comprises a plurality of sacrificial thin films 132 and a plurality of flexible protecting thin films 134, wherein the sacrificial thin films 132 and the flexible protecting thin films 134 are alternately stacked on one another and are configured on the top electrode layer T of the environmental sensitive element 120 and the bottommost sacrificial thin film 132 is connected to the top electrode layer T. Moreover, the flexible protecting thin films 134 of the present embodiment are disconnected to the top electrode layer T.

The Third Embodiment

Figure 3A:
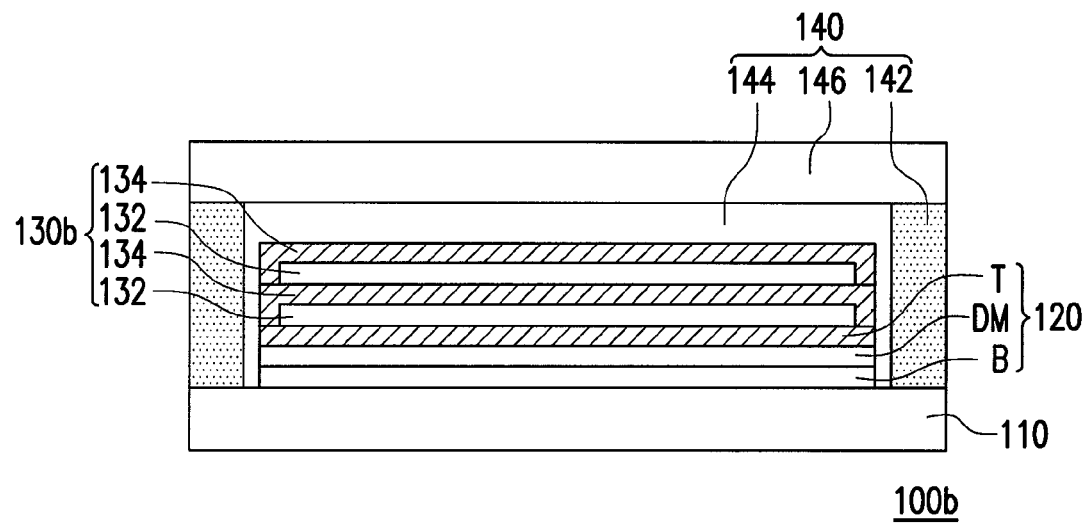
FIG. 3A and FIG. 3B are the cross-sectional views of a package of an environmental sensitive element according to the third embodiment of the present disclosure.
Figure 3B:
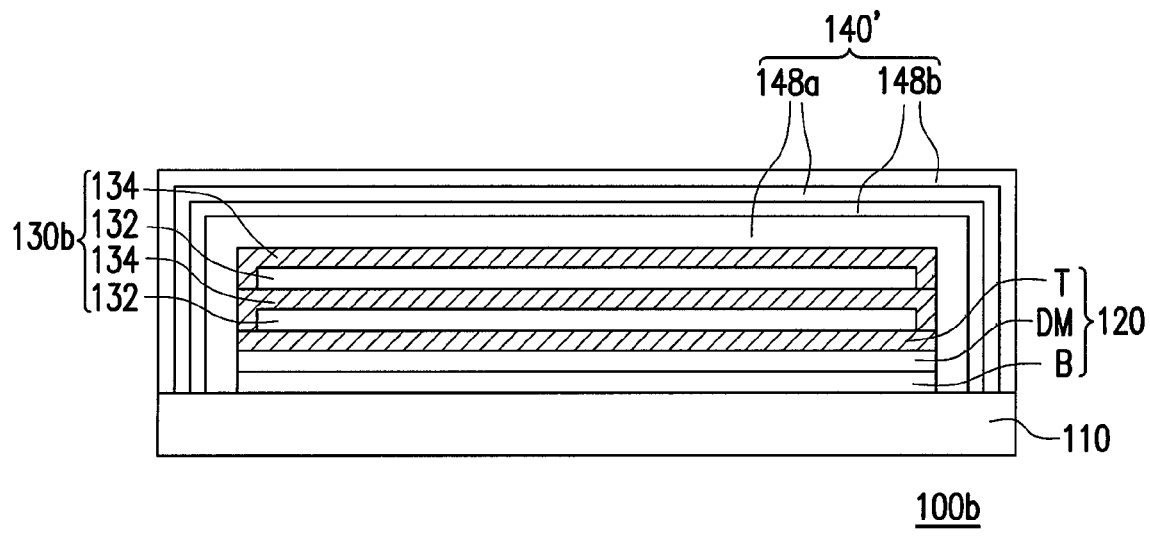

FIG. 3A and FIG. 3B are the cross-sectional views of a package of an environmental sensitive element according to the third embodiment of the present disclosure. As shown in FIG. 3A and FIG. 3B, the package 100b of the environmental sensitive element of the present embodiment is similar to the package 100a of the environmental sensitive element of the second embodiment. More clearly, the thin film structure of the flexible sacrificial layer 130b in the package 100b is different from that of the flexible sacrificial layer 130a in the package 100a. The flexible sacrificial layer 130b comprises a plurality of sacrificial thin films 132 and a plurality of flexible protecting thin films 134, wherein the sacrificial thin films 132 and the flexible protecting thin films 134 are alternately stacked on one another and are configured on the top electrode layer T of the environmental sensitive element 120 and the bottommost sacrificial thin film 132 and all of the flexible protecting thin films 134 are connected to the top electrode layer T.

Experimental Example

Table 1 is a detailed explanation of the structure of the package of the environmental sensitive element, wherein illuminant area of the package is about 0.3 centimeter×0.3 centimeter.

TABLE 1

| | Lower Sustrate | Electrode | HTL | EML (Dopant:Host) | | ETL | EIL/top electrode | Flexible Structure Layer | Upper Substrate |
|---|---|---|---|---|---|---|---|---|---|
| Experimental group I | PES | ITO | NPB 200 Å | Ir(ppy)$_3$ 7% | CBP 300 Å | Bphen 300 Å | LiF5 Å/ Al 1500 Å | NPB/Al 1500 Å/ 1500 Å | Metal Foil |
| Control group I | PES | ITO | NPB 200 Å | Ir(ppy)$_3$ 7% | CBP 300 Å | Bphen 300 Å | LiF5 Å/ Al 1500 Å | NPB/Al/ 0 Å/0 Å | Metal Foil |

The package of the environmental sensitive element manufactured according to the standards of the experimental group I and control group I is normally lighting on before it goes through the bending test. After the bending test (the package is bent for 500 times with a radius of curvature of about 5 centimeter), the package of the environmental sensitive element of the control group I can not light on. The package of the environmental sensitive element of the experimental group I is driven by a voltage of 4V to light on with a brightness about 820Cd/m^2 and a light emitting efficiency about 14.0 Cd/A before it goes through the bending test. After the bending test (the package is bent for 500 times with a radius of curvature of about 5 centimeter), the package of the environmental sensitive element of the experimental group I is driven by a voltage of 4V to light on with a brightness about 793 Cd/m^2 and a light emitting efficiency about 13.9 Cd/A.

Obviously, the light emitting efficiency of the package of the environmental sensitive element of the experimental group I (i.e. one of the embodiments of the present disclosure) does not significantly decayed.

The Fourth Embodiment

Figure 4A:
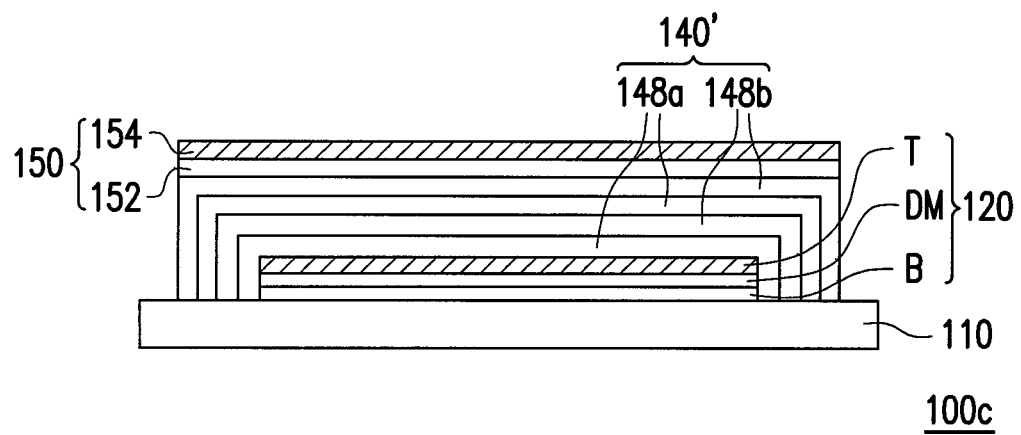
FIG. 4A is the cross-sectional view of a package of an environmental sensitive element according to the fourth embodiment of the present disclosure.
Figure 4B:
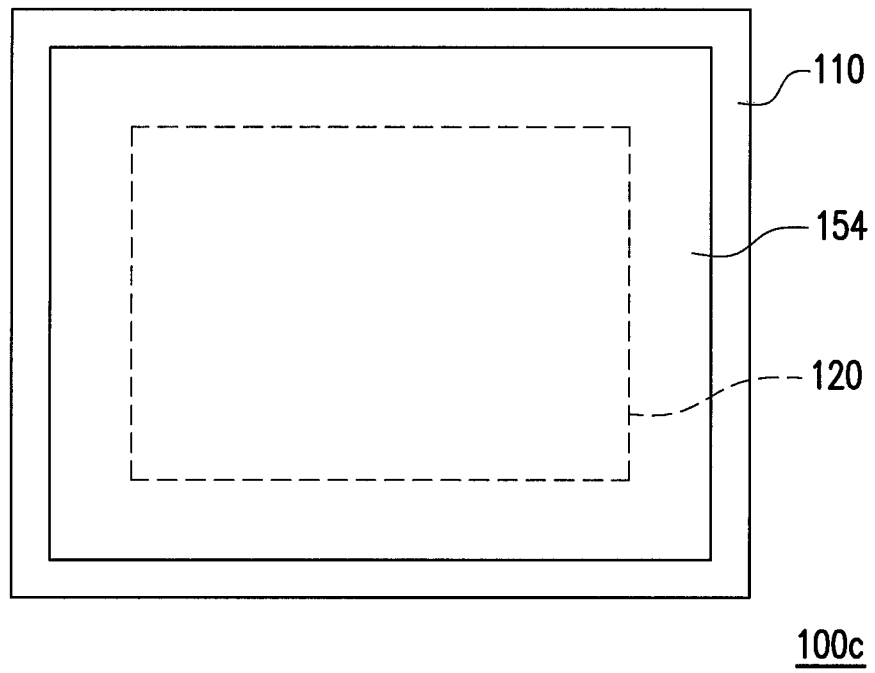
FIG. 4B is the top view of the package of the environmental sensitive element in FIG. 4A.

FIG. 4A is the cross-sectional view of a package of an environmental sensitive element according to the fourth embodiment of the present disclosure. FIG. 4B is the top view of the package of the environmental sensitive element in FIG. 4A. As shown in FIG. 4A and FIG. 4B, the package 100c of the environmental sensitive element of the present embodiment is similar to the package 100 of the environmental sensitive element of the first embodiment. Specifically, the first packaging structure 140' covers the environmental sensitive element 120 and a first flexible sacrificial layer 150 is disposed on the first packaging structure 140', wherein the environmental sensitive element 120 and the first flexible sacrificial layer 150 are located on two opposite sides of the first packaging structure 140'. The first packaging structure 140' comprises at least one layer of organic package thin films 148a and at least one layer of inorganic package thin films 148b.

As shown in FIG. 4A, the first flexible sacrificial layer 150 comprises a first sacrificial thin film 152 and a first flexible protecting thin film 154, wherein the first sacrificial thin film 152 is configured on the first packaging structure 140' and the first flexible protecting thin film 154 is configured on the first sacrificial thin film 152. It should be noticed that, the first sacrificial thin film 152 of the present embodiment is connected to the first packaging structure 140', but the first flexible protecting thin film 154 is disconnected to the first packaging structure 140'. In other embodiments of the present disclosure, the first flexible protecting thin film 154 disposed on the first sacrificial thin film 152 can be connected to the first packaging structure 140'. The bonding strength between the first sacrificial thin film 152 and the first packaging structure 140' is substantially equal to or lower than the bonding strength between two adjacent first thin films (DM, B and T) so that the delaminating phenomenon hardly happens between the adjacent first thin films (DM, B and T) but easily happens on the interface between the first sacrificial thin film 152 and the first packaging structure 140' and on the interface between the first sacrificial thin film 152 and the first flexible protecting thin film 154 when the package of the environmental sensitive element is bent. Therefore, the first sacrificial thin film 152 and the first flexible protecting thin film 154 can effectively protect the first thin films (DM, B and T) from having delaminating phenomenon during the package is bent. In addition, the first flexible sacrificial layer 150 further has a UV cutting function so as to increase the life time of the environmental sensitive element 120. And also the first flexible sacrificial layer 150 further has a light out coupling function so as to increase the light efficiency of the environmental sensitive element 120.

In the present embodiment, the material of the first sacrificial thin film 152 is identical to the material of the sacrificial thin film 132, and the material of the first flexible protecting thin film 154 is identical to the material of the flexible protecting thin film 134. It should be noticed that the materials of the first sacrificial thin film 152 and the first flexible protecting thin film 154 in the first flexible sacrificial layer 150 are selected from different material groups such that the bonding strength between the first sacrificial thin film 152 and the first flexible protecting thin film 154 is substantially equal to or smaller than the bonding strength between the adjacent first thin films (DM, B and T).

As shown in FIG. 4A and FIG. 4B, the first flexible sacrificial layer 150 is greater than the size of the environmental sensitive element 120 in the present embodiment. However, in other embodiments, the size of the first flexible sacrificial layer 150 can be equal to the size of the environmental sensitive element 120.

The Fifth Embodiment

Figure 5A:
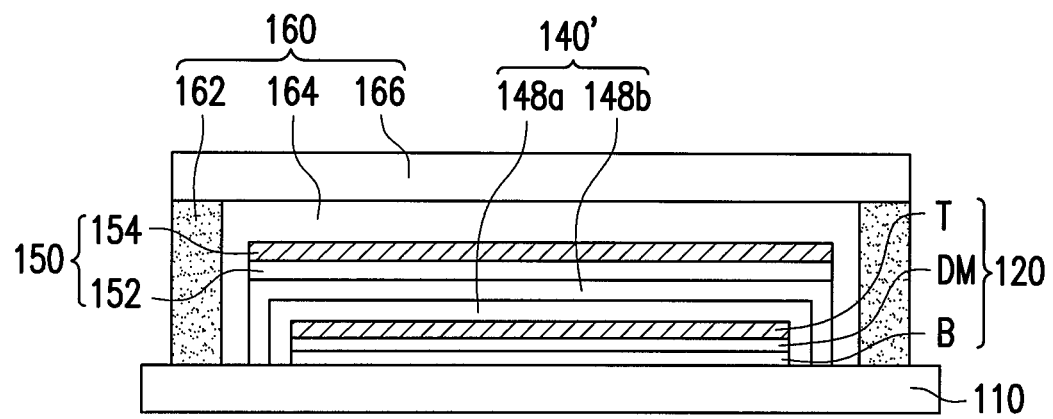
FIG. 5A is the cross-sectional view of a package of an environmental sensitive element according to the fifth embodiment of the present disclosure.
Figure 5B:
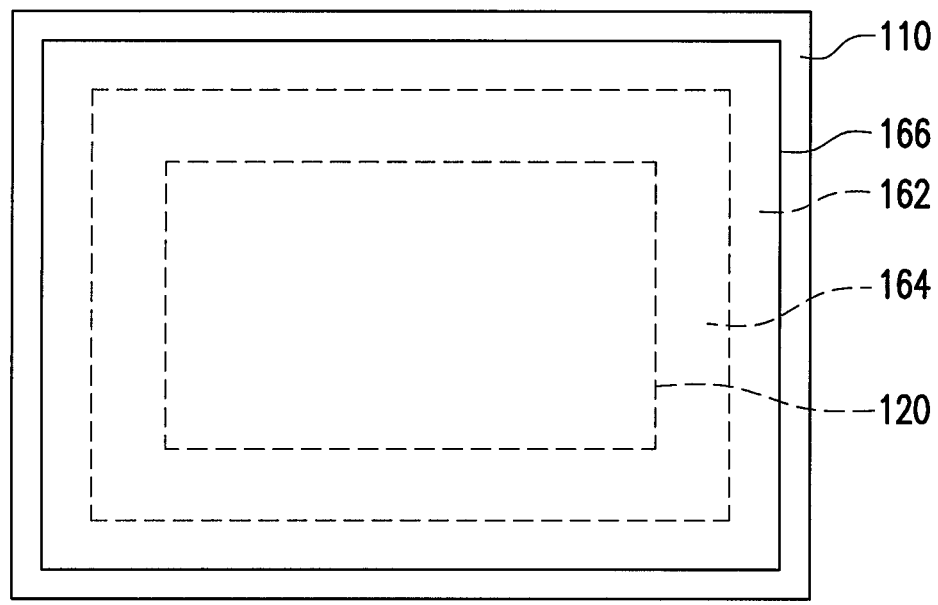
FIG. 5B is the top view of the package of the environmental sensitive element in FIG. 5A.

FIG. 5A is the cross-sectional view of a package of an environmental sensitive element according to the fifth embodiment of the present disclosure. FIG. 5B is the top view of the package of the environmental sensitive element in FIG. 5A. As shown in FIG. 5A and FIG. 5B, the package 100d of the environmental sensitive element of the present embodiment is similar to the package 100c of the environmental sensitive element of the fourth embodiment. Specifically, the package 100d of the environmental sensitive element of the present embodiment further comprises a second packaging structure 160 covering the environmental sensitive element 120, the first packaging structure 140' and the first flexible sacrificial layer 150. The second packaging structure 160 comprises a sealant 162, an adhesion layer 164 and a flexible cover 166. The sealant 162 is disposed on the flexible substrate 110 to encircle the environmental sensitive element 120 and the first flexible sacrificial layer 150. The adhesion layer 164 is disposed within the sealant 162 to cover the environmental sensitive element 120 and the first flexible sacrificial layer 150. Further, the flexible cover 166 is connected with the sealant 162 and the adhesion layer 164.

As shown in FIG. 5A and FIG. 5B, the sealant 162 of the second packaging structure 160 has a continuous pattern encircling the environmental sensitive element 120. However, in other embodiments, the sealant 162 of the second packaging structure 160 may have a non-continuous pattern encircling the environmental sensitive element 120. For example, the sealant 162 may includes a plurality of patterns separated from each other, wherein the separated patterns are arranged in a continuous form so as to encircle the environmental sensitive element 120. In addition, the material of the sealant 162 and the material of the adhesion layer 164 are different in the present embodiment. However, in other embodiments, the material of the sealant 162 and the material of the adhesion layer 164 may be identical.

The Sixth Embodiment

Figure 6A:
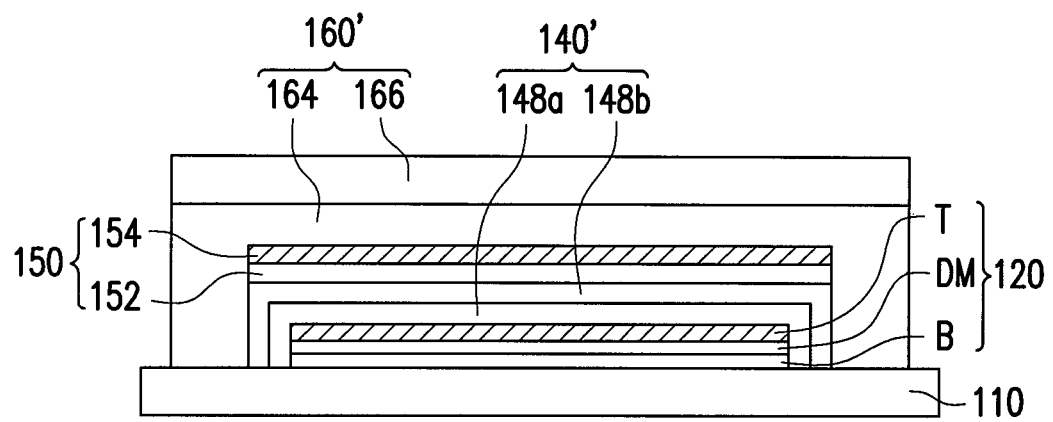
FIG. 6A is the cross-sectional view of a package of an environmental sensitive element according to the sixth embodiment of the present disclosure.
Figure 6B:
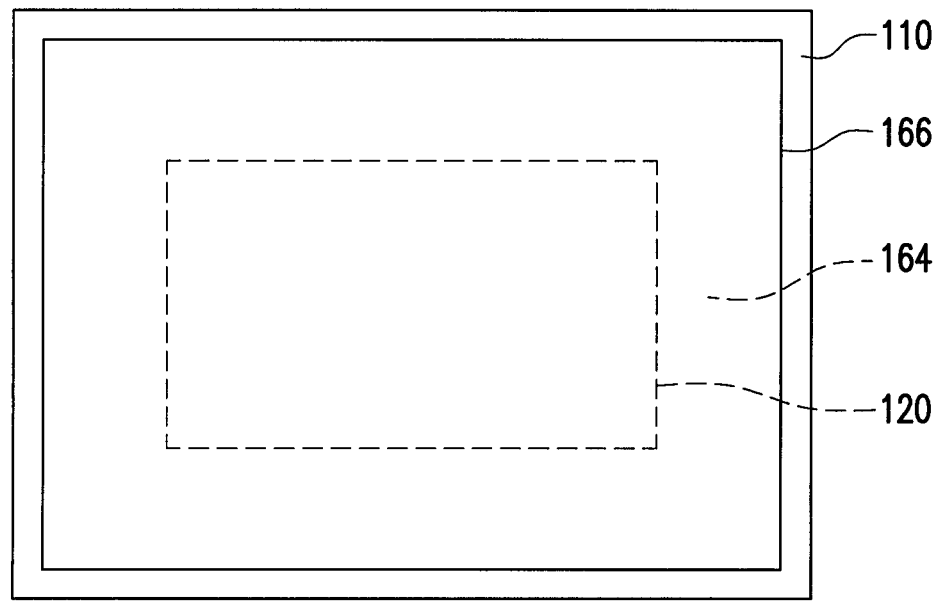
FIG. 6B is the top view of the package of the environmental sensitive element in FIG. 6A.

FIG. 6A is the cross-sectional view of a package of an environmental sensitive element according to the sixth embodiment of the present disclosure. FIG. 6B is the top view of the package of the environmental sensitive element in FIG. 6A. As shown in FIG. 6A and FIG. 6B, the package 100e of the environmental sensitive element of the present embodiment is similar to the package 100d of the environmental sensitive element of the fifth embodiment. Specifically, the adhesion layer 164 of a second packaging structure 160' is a film type adhesive. The adhesion layer 164 covers the environmental sensitive element 120 and the first flexible sacrificial layer 150. Further, the flexible cover 166 is connected with the adhesion layer 164.

The Seventh Embodiment

Figure 7:
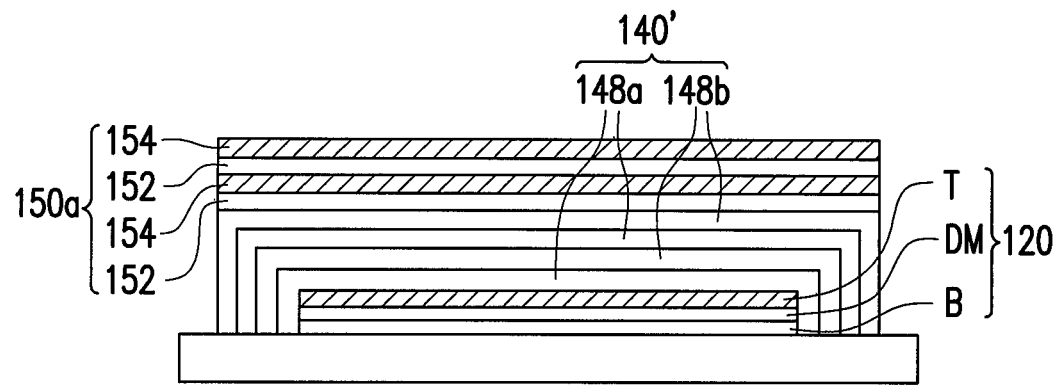
FIG. 7 is the cross-sectional view of a package of an environmental sensitive element according to the seventh embodiment of the present disclosure.

FIG. 7 is the cross-sectional view of a package of an environmental sensitive element according to the seventh embodiment of the present disclosure. As shown in FIG. 7, the package 100f of the environmental sensitive element of the present embodiment is similar to the package 100c of the environmental sensitive element of the fourth embodiment. Specifically, the thin film structure of the first flexible sacrificial layer 150a in the package 100f is different from that of the first flexible sacrificial layer 150 in the package 100c. The first flexible sacrificial layer 150a comprises a plurality of first sacrificial thin films 152 and a plurality of first flexible protecting thin films 154, wherein the first sacrificial thin films 152 and the first flexible protecting thin films 154 are alternately stacked on one another and are configured on the first packaging structure 140' and the bottommost first sacrificial thin film 152 is connected to the first packaging structure 140'. Moreover, as shown in FIG. 7, the first flexible protecting thin films 154 of the present embodiment are disconnected to the first packaging structure 140'.

The Eighth Embodiment

Figure 8:
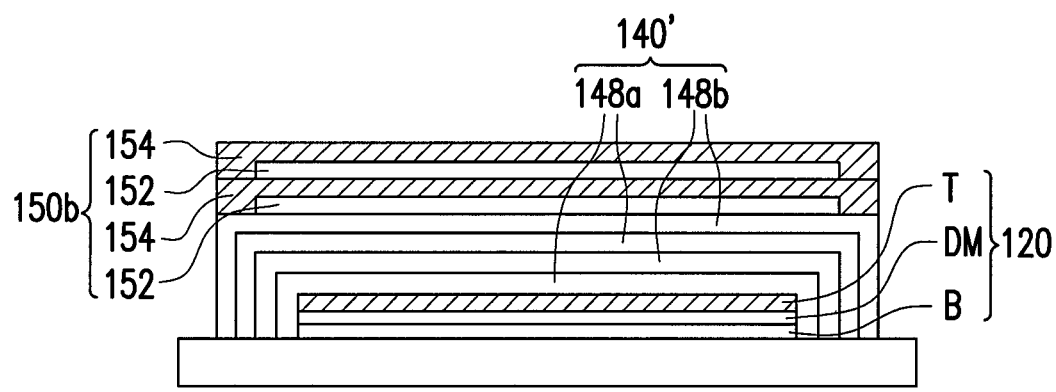
FIG. 8 is the cross-sectional view of a package of an environmental sensitive element according to the eighth embodiment of the present disclosure.

FIG. 8 is the cross-sectional view of a package of an environmental sensitive element according to the eighth embodiment of the present disclosure. As shown in FIG. 8, the package 100g of the environmental sensitive element of the present embodiment is similar to the package 100f of the environmental sensitive element in FIG. 7. Specifically, the thin film structure of the first flexible sacrificial layer 150b in the package 100g is different from that of the first flexible sacrificial layer 150a in the package 100f. The first flexible sacrificial layer 150b comprises a plurality of first sacrificial thin films 152 and a plurality of first flexible protecting thin films 154, wherein the first sacrificial thin films 152 and the first flexible protecting thin films 154 are alternately stacked on one another and are configured on the first packaging structure 140' and the bottommost first sacrificial thin film 152 and the bottommost first flexible protecting thin films 154 are connected to the first packaging structure 140'.

The Ninth Embodiment

Figure 9:
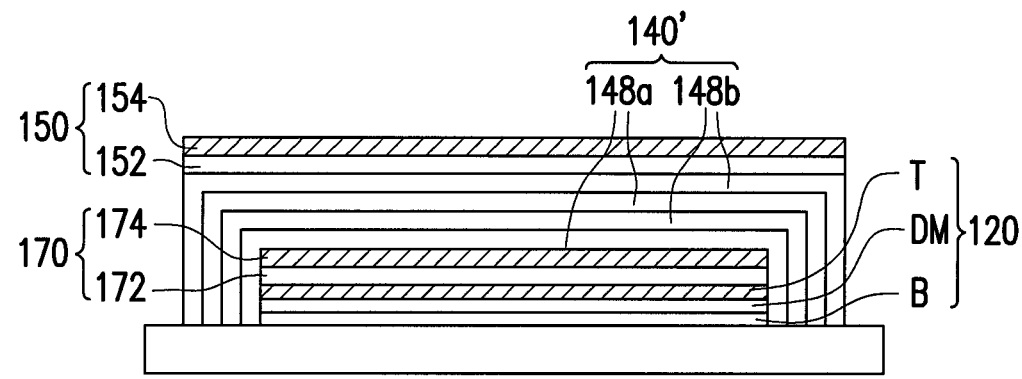
FIG. 9 is the cross-sectional view of a package of an environmental sensitive element according to the ninth embodiment of the present disclosure.

FIG. 9 is the cross-sectional view of a package of an environmental sensitive element according to the ninth embodiment of the present disclosure. As shown in FIG. 9, the package 100h of the environmental sensitive element of the present embodiment is similar to the package 100c of the environmental sensitive element of the fourth embodiment. Specifically, the package 100h further comprises a second flexible sacrificial layer 160 disposed on the environmental sensitive element 120.

As shown in FIG. 9, the second flexible sacrificial layer 170 comprises a second sacrificial thin film 172 and a second flexible protecting thin film 174, wherein the second sacrificial thin film 172 is configure on the top electrode layer T of the environmental sensitive element 120 and the second flexible protecting thin film 174 is configured on the second sacrificial thin film 172. It should be noticed that, the second sacrificial thin film 172 of the present embodiment is connected to the top electrode layer T, but the second flexible protecting thin film 174 is disconnected to the top electrode layer T. However, in other embodiments of the present disclosure, the second flexible protecting thin film 174 disposed on the second sacrificial thin film 172 can be connected to the top electrode layer T.

In the present embodiment, the material of the second sacrificial thin film 172 is identical to the material of the sacrificial thin film 132, and the material of the second flexible protecting thin film 174 is identical to the material of the flexible protecting thin film 134. It should be noticed that the materials of the second sacrificial thin film 172 and the second flexible protecting thin film 174 in the second flexible sacrificial layer 170 are selected from different material groups such that the bonding strength between the second sacrificial thin film 172 and the second flexible protecting thin film 174 is substantially equal to or smaller than the bonding strength between the adjacent first thin films (DM, B and T).

Further, the bonding strength between the second sacrificial thin film 172 and the top electrode layer T is substantially equal to or lower than the bonding strength between two adjacent first thin films (DM, B and T) so that the delaminating phenomenon hardly happens between the adjacent first thin films (DM, B and T) but easily happens on the interface between the second sacrificial thin film 172 and the top electrode layer T and on the interface between the second sacrificial thin film 172 and the second flexible protecting thin film 174 when the package of the environmental sensitive element is bent. Therefore, the second sacrificial thin film 172 and the second flexible protecting thin film 174 can effectively protect the first thin films (DM, B and T) from having delaminating phenomenon during the package is bent. In addition, the second flexible sacrificial layer 170 further has a UV cutting function so as to increase the life time of the environmental sensitive element 120. And also the second flexible sacrificial layer 170 further has a light out coupling function so as to increase the light efficiency of the environmental sensitive element 120.

The Tenth Embodiment

Figure 10:
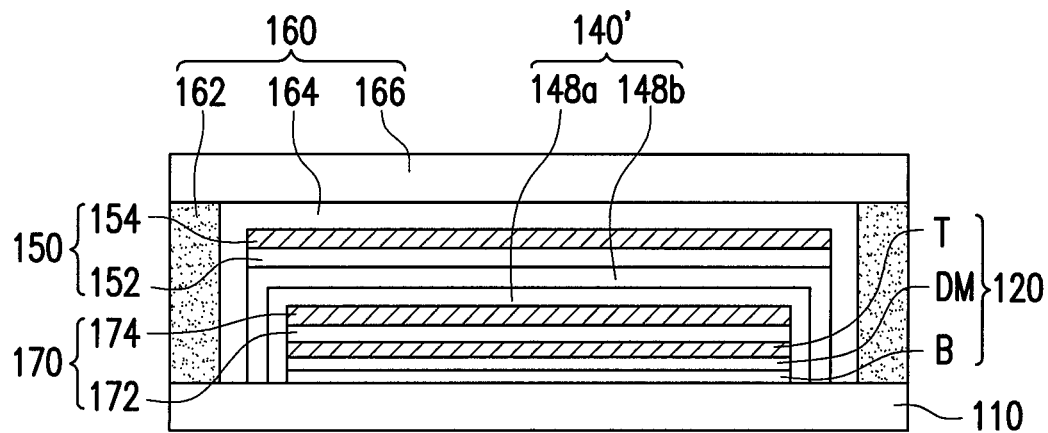
FIG. 10 is the cross-sectional view of a package of an environmental sensitive element according to the tenth embodiment of the present disclosure.

FIG. 10 is the cross-sectional view of a package of an environmental sensitive element according to the tenth embodiment of the present disclosure. As shown in FIG. 10, the package 100i of the environmental sensitive element of the present embodiment is similar to the package 100h of the environmental sensitive element of the ninth embodiment. Specifically, the package 100i of the environmental sensitive element of the present embodiment further comprises a second packaging structure 160 covering the environmental sensitive element 120, the first packaging structure 140', the first flexible sacrificial layer 150 and the second flexible sacrificial layer 170.

The Eleventh Embodiment

Figure 11:
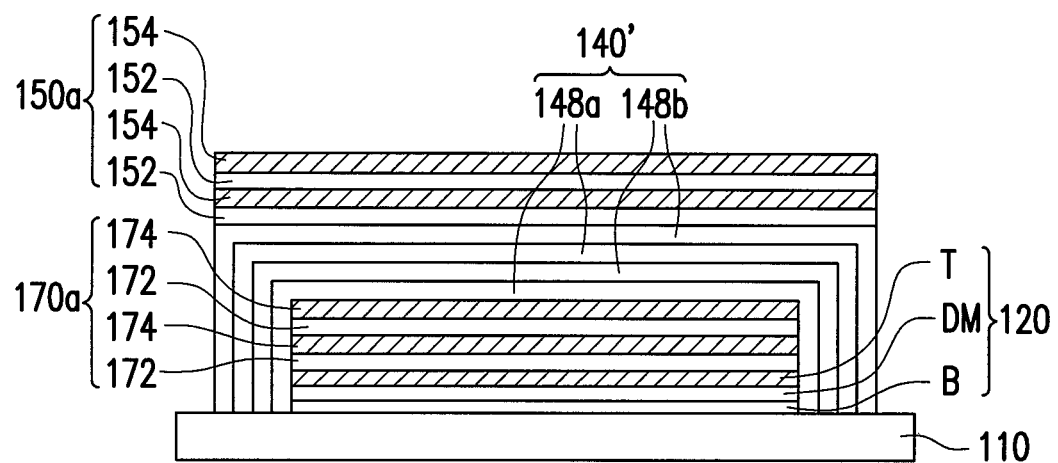
FIG. 11 is the cross-sectional view of a package of an environmental sensitive element according to the eleventh embodiment of the present disclosure.

FIG. 11 is the cross-sectional view of a package of an environmental sensitive element according to the eleventh embodiment of the present disclosure. As shown in FIG. 11, the package 100j of the environmental sensitive element of the present embodiment is similar to the package 100h of the environmental sensitive element of the ninth embodiment. Specifically, the thin film structure of the first flexible sacrificial layer 150a in the package 100j is different from that of the first flexible sacrificial layer 150 in the package 100h. The first flexible sacrificial layer 150a comprises a plurality of first sacrificial thin films 152 and a plurality of first flexible protecting thin films 154, wherein the first sacrificial thin films 152 and the first flexible protecting thin films 154 are alternately stacked on one another and are configured on the first packaging structure 140' and the bottommost first sacrificial thin film 152 is connected to the first packaging structure 140'. Moreover, as shown in FIG. 10, the first flexible protecting thin films 154 of the present embodiment are disconnected to the first packaging structure 140'.

Furthermore, the thin film structure of the second flexible sacrificial layer 170a in the package 100j is different from that of the second flexible sacrificial layer 170 in the package 100h. The second flexible sacrificial layer 170a comprises a plurality of second sacrificial thin films 172 and a plurality of second flexible protecting thin films 174, wherein the second sacrificial thin films 172 and the second flexible protecting thin films 174 are alternately stacked on one another and are configured on the environmental sensitive element 120, and the bottommost second sacrificial thin film 172 is connected to the environmental sensitive element 120. Moreover, as shown in FIG. 10, the second flexible protecting thin films 174 of the present embodiment are disconnected to the environmental sensitive element 120.

The Twelfth Embodiment

Figure 12:
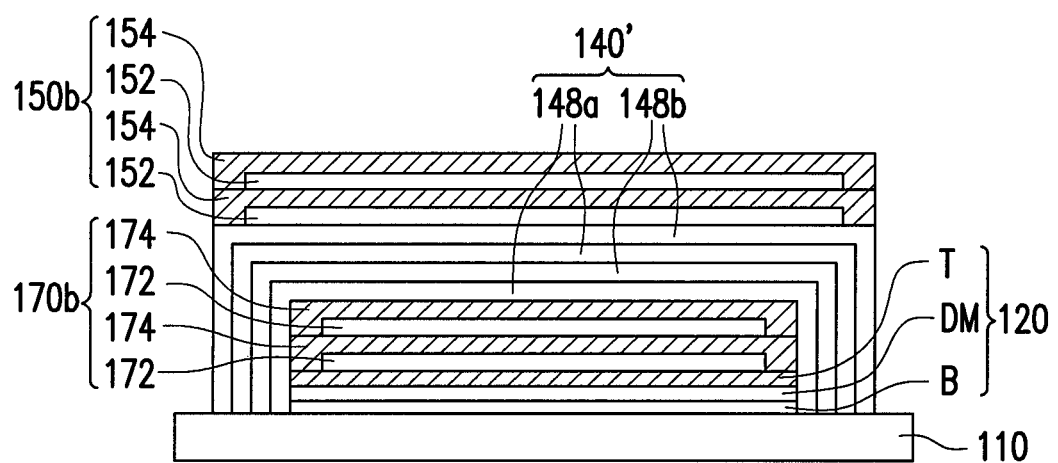
FIG. 12 is the cross-sectional view of a package of an environmental sensitive element according to the twelfth embodiment of the present disclosure.

FIG. 12 is the cross-sectional view of a package of an environmental sensitive element according to the twelfth embodiment of the present disclosure. As shown in FIG. 12, the package 100k of the environmental sensitive element of the present embodiment is similar to the package 100j of the environmental sensitive element of the eleventh embodiment. Specifically, the thin film structures of the first flexible sacrificial layer 150b in the package 100k is different from that of the first flexible sacrificial layer 150a in the package 100j. The bottommost first sacrificial thin film 152 and the bottommost first flexible protecting thin film 154 are connected to the first packaging structure 140'.

Furthermore, the thin film structure of the second flexible sacrificial layer 170b in the package 100k is different from that of the second flexible sacrificial layer 170a in the package 100j. The bottommost second sacrificial thin film 172 and the bottommost second flexible protecting thin film 174 are connected to the environmental sensitive element 120.

According to the above embodiments and the experimental example, since the flexible sacrificial layer with various types is formed on the environmental sensitive element, when the environmental sensitive element is exaggeratedly bent, the delaminating happens in the flexible sacrificial layer. Therefore, the environmental sensitive element can be prevented from the delaminating phenomenon due to being bent and the structure of the environmental sensitive element can be prevented from being damaged during it is bent.

What is claimed is:

1. A package of an environmental sensitive element, comprising:
   a flexible substrate;
   an environmental sensitive element disposed on the flexible substrate;
   a first packaging structure covering the environmental sensitive element; and
   a first flexible sacrificial layer disposed on the first packaging structure, and the first flexible sacrificial layer and the environmental sensitive element being located on two opposite sides of the first packaging structure, wherein the environmental sensitive element comprises a plurality of first thin films, the first flexible sacrificial layer includes a plurality of second thin films, and the bonding strength between two adjacent second thin films is equal to or lower than the bonding strength between two adjacent first thin films.

2. The package of claim 1, wherein the first thin films in the environmental sensitive element comprises:
   a bottom electrode layer disposed on the flexible substrate;
   a displaying medium disposed on bottom electrode layer; and
   a top electrode layer disposed on the displaying medium.

3. The package of claim 2, wherein the second thin films in the first flexible sacrificial layer comprises:
   at least one first sacrificial thin film disposed on the first packaging structure; and
   at least one first flexible protecting thin film disposed on the first sacrificial thin film.

4. The package of claim 3, wherein the first sacrificial thin film is connected to the first packaging structure, and the first flexible protecting thin film is disconnected to the first packaging structure.

5. The package of claim 3, wherein both of the first sacrificial thin film and the first flexible protecting thin film are connected to the first packaging structure.

6. The package of claim 3, wherein the bonding strength between the first sacrificial thin film and the first packaging structure is equal to or lower than the bonding strength between two adjacent first thin films.

7. The package of claim 3, wherein the material of the first sacrificial thin film includes organic small molecular material with the molecular weight about 10 g/mol~5000 g/mol.

8. The package of claim 3, wherein the material of the first sacrificial thin film includes organic oligomers with the molecular weight about 500 g/mol~9000 g/mol.

9. The package of claim 3, wherein the material of the first sacrificial thin film includes organic small molecular material or a mixture of oligomers and inorganic material, and the atomic weight or the molecular weight of the inorganic material is about 3 g/mol~500 g/mol.

10. The package of claim 3, wherein the material of the first sacrificial thin film includes Alq3 (Tris-(8-hydroxyquinoline) aluminum), alpha-NPB (N,N'-Dis(naphthalene-1-yl)-N,N'-diphenyl-benzidine), CuPc (Phalocyanine copper complex).

11. The package of claim 3, wherein the material of the first flexible protecting thin film comprises indium tin oxide (ITO), indium zinc oxide (IZO), aluminum doped zinc oxide (AZO), $WO_3$, $MoO_3$, $SiO_x$, $SiN_x$, $SiO_xN_y$, $Al_2O_3$, Al, Ag, Mg—Ag or Mg—Al.

12. The package of claim 3, wherein the material of the top electrode layer is equal to the material of the first flexible protecting thin film.

13. The package of claim 3, further comprising a second flexible sacrificial layer disposed on the environmental sensitive element, and the first packaging structure covering the environmental sensitive element and the second flexible sacrificial layer, wherein the second flexible sacrificial layer comprises a plurality of third thin films, and the bonding strength between two adjacent third thin films is equal to or lower than the bonding strength between two adjacent first thin films.

14. The package of claim 13, wherein the third thin films in the second flexible sacrificial layer comprises:
   a second sacrificial thin film disposed on the top electrode; and
   a second flexible protecting thin film disposed on the second sacrificial thin film.

15. The package of claim 13, wherein the third thin films in the second flexible sacrificial layer comprises:
   a plurality of second sacrificial thin films; and
   a plurality of second flexible protecting thin films, wherein the second sacrificial thin films and the second flexible protecting thin films are alternately stacked on the environmental sensitive element, and the bottommost second sacrificial thin film is connected to the top electrode layer.

16. The package of claim 1, wherein the material of the flexible substrate comprises plastic material or metal thin film.

17. The package of claim 1, wherein the first packaging structure comprises a plurality of package thin films stacked by one another.

18. The package of claim 17, wherein the package thin films comprises at least a layer of organic package thin film or a least a layer of inorganic package thin film.

19. The package of claim 17, wherein the package thin films comprise:
   a plurality of organic package thin films; and
   a plurality of inorganic package thin films, wherein the organic package thin films and the inorganic package thin films are alternately stacked on one another.

20. The package of claim 1, further comprising a second packaging structure, wherein the second packaging structure comprises:
   a sealant disposed on the flexible substrate to encircle the environmental sensitive element, the first packaging structure and the first flexible sacrificial layer;
   an adhesion layer disposed within the sealant to cover the environmental sensitive element, the first packaging structure and the first flexible sacrificial layer; and
   a flexible cover connected with the sealant and the adhesion layer.

21. The package of claim 1, further comprising a second packaging structure, wherein the second packaging structure comprises:
   an adhesion layer covering the environmental sensitive element, the first packaging structure and the first flexible sacrificial layer; and
   a flexible cover connected with the sealant and the adhesion layer.

22. The package of claim 1, wherein the material of the first flexible sacrificial layer includes UV cutting material.

\* \* \* \* \*